United States Patent
Filippi et al.

(10) Patent No.: US 9,478,509 B2
(45) Date of Patent: Oct. 25, 2016

(54) MECHANICALLY ANCHORED BACKSIDE C4 PAD

(71) Applicant: GLOBALFOUNDRIES INC., Grand Cayman (KY)

(72) Inventors: Ronald G. Filippi, Wappingers Falls, NY (US); Erdem Kaltalioglu, Newburgh, NY (US); Andrew T. Kim, Poughkeepsie, NY (US); Ping-Chuan Wang, Hopewell Junction, NY (US); Lijuan Zhang, Beacon, NY (US)

(73) Assignee: GlobalFoundries, Inc., Grand Cayman (KY)

( * ) Notice: Subject to any disclaimer, the term of this patent is extended or adjusted under 35 U.S.C. 154(b) by 135 days.

(21) Appl. No.: 14/198,711

(22) Filed: Mar. 6, 2014

(65) Prior Publication Data
US 2015/0255410 A1   Sep. 10, 2015

(51) Int. Cl.
*H01L 23/00* (2006.01)
*H01L 23/48* (2006.01)

(52) U.S. Cl.
CPC .............. *H01L 24/05* (2013.01); *H01L 24/03* (2013.01); *H01L 24/13* (2013.01); *H01L 23/481* (2013.01); *H01L 24/08* (2013.01); *H01L 24/11* (2013.01); *H01L 24/29* (2013.01); *H01L 24/32* (2013.01); *H01L 24/94* (2013.01); *H01L 2224/039* (2013.01); *H01L 2224/0332* (2013.01); *H01L 2224/0345* (2013.01); *H01L 2224/0346* (2013.01); *H01L 2224/0361* (2013.01); *H01L 2224/0391* (2013.01); *H01L 2224/03312* (2013.01); *H01L 2224/03426* (2013.01); *H01L 2224/03452* (2013.01); *H01L 2224/03462* (2013.01); *H01L 2224/03616* (2013.01); *H01L 2224/03914* (2013.01); *H01L 2224/0401* (2013.01); *H01L 2224/05012* (2013.01); *H01L 2224/05015* (2013.01); *H01L 2224/05018* (2013.01); *H01L 2224/05073* (2013.01); *H01L 2224/05082* (2013.01); *H01L 2224/05187* (2013.01); *H01L 2224/05552* (2013.01); *H01L 2224/05557* (2013.01); *H01L 2224/05559* (2013.01); *H01L 2224/05567* (2013.01); *H01L 2224/05624* (2013.01); *H01L 2224/05655* (2013.01); *H01L 2224/05671* (2013.01); *H01L 2224/08145* (2013.01); *H01L 2224/1132* (2013.01); *H01L 2224/1145* (2013.01); *H01L 2224/1146* (2013.01);
(Continued)

(58) Field of Classification Search
CPC ................... H01L 21/76804; H01L 21/76805
See application file for complete search history.

(56) References Cited

U.S. PATENT DOCUMENTS

| | | |
|---|---|---|
| 6,011,301 A | 1/2000 | Chiu |
| 6,214,643 B1 | 4/2001 | Chiu |

(Continued)

FOREIGN PATENT DOCUMENTS

WO    2013036395 A1    3/2013

*Primary Examiner* — Mohammad Choudhry
(74) *Attorney, Agent, or Firm* — Hoffman Warnick LLC; Yuanmin Cai

(57) ABSTRACT

The present invention relates generally to flip chip technology and more particularly, to a method and structure for fabricating a mechanically anchored controlled collapse chip connection (C4) pad on a semiconductor structure. In an embodiment, a method is disclosed that may include forming a bonding pad having one or more anchor regions that extend into a semiconductor structure and may inhibit the bonding pad from physically separating from the TSV during temperature fluctuations.

18 Claims, 17 Drawing Sheets

(52) U.S. Cl.
CPC ............ *H01L 2224/11312* (2013.01); *H01L 2224/11462* (2013.01); *H01L 2224/131* (2013.01); *H01L 2224/1317* (2013.01); *H01L 2224/13022* (2013.01); *H01L 2224/13025* (2013.01); *H01L 2224/13083* (2013.01); *H01L 2224/13084* (2013.01); *H01L 2224/13111* (2013.01); *H01L 2224/13116* (2013.01); *H01L 2224/13124* (2013.01); *H01L 2224/13144* (2013.01); *H01L 2224/13147* (2013.01); *H01L 2224/13155* (2013.01); *H01L 2224/13166* (2013.01); *H01L 2224/13171* (2013.01); *H01L 2224/13181* (2013.01); *H01L 2224/13184* (2013.01); *H01L 2224/2919* (2013.01); *H01L 2224/32145* (2013.01); *H01L 2224/94* (2013.01); *H01L 2924/12042* (2013.01)

(56) References Cited

U.S. PATENT DOCUMENTS

| | | | |
|---|---|---|---|
| 7,935,408 | B2 | 5/2011 | Daubenspeck et al. |
| 8,084,865 | B2 | 12/2011 | Hirler et al. |
| 8,361,598 | B2 | 1/2013 | Daubenspeck et al. |
| 8,389,340 | B2 | 3/2013 | Topacio et al. |
| 2008/0169555 | A1 | 7/2008 | Topacio et al. |
| 2010/0096760 | A1* | 4/2010 | Yu .......................... H01L 24/05 257/774 |
| 2012/0001337 | A1* | 1/2012 | Tsai .................... H01L 21/6835 257/770 |
| 2012/0013022 | A1* | 1/2012 | Sabuncuoglu Tezcan ............... H01L 21/7682 257/774 |
| 2013/0256910 | A1* | 10/2013 | Lee .................. H01L 21/76802 257/774 |

* cited by examiner

MECHANICALLY ANCHORED BACKSIDE C4 PAD

BACKGROUND

The present invention relates generally to flip chip technology and more particularly, to a method and structure for fabricating a mechanically anchored controlled collapse chip connection (C4) pad on a semiconductor structure.

The packaging industry has adopted the widespread use of flip chip technology for high performance applications. In a typical flip chip package, a semiconductor die may be bumped with individual conducting pads over its entire area. These conducting pads may be connected to front side devices present on the same semiconductor die by through substrate vias (TSVs). The conducting pads on the semiconductor die may also be connected to corresponding conducting pads on a substrate (or, in a three-dimensional package, another semiconductor die or interposer) using small solder balls, or bumps, such as controlled collapse chip connections (C4 connections). The conducting pads on the substrate may be connected to circuitry that routes the electrical signals to an array of conductors (ball grid arrays (BGA)), column grid arrays (CGA) or land grid arrays (LGA)) to electrically connect to a printed circuit board.

SUMMARY

According to an embodiment, a method is disclosed. The method may include: forming a through substrate via (TSV) that extends from a front side of a semiconductor substrate to an interior region of the semiconductor substrate; recessing a back side of the substrate to expose a bottom surface of the TSV; forming an anchor trench in the back side of the semiconductor substrate adjacent to the TSV; forming a diffusion barrier on the back side of the semiconductor substrate and within the anchor trench, so that the bottom surface of the TSV is substantially coplanar with a bottom surface of the diffusion barrier; and depositing a conductive material on the diffusion barrier and within the anchor trench to form a bonding pad comprising an anchor region, so that the conductive material is in direct electrical contact with the bottom surface of the TSV.

According to another embodiment, a structure is disclosed. The structure may include: a through substrate via (TSV) extending from a front side of a semiconductor substrate to a back side of the semiconductor substrate, the TSV made of a first conductive material; a bonding pad on the back side of the semiconductor substrate in direct contact with a bottom surface of the TSV, the bonding pad may be made of a second conductive material and may include an anchor region extending into and engaging the semiconductor substrate adjacent to the TSV; and a diffusion barrier between the bonding pad and the semiconductor substrate to prevent the second conductive material of the bonding pad from diffusing into the semiconductor substrate.

According to another embodiment, a method is disclosed. The method may include: forming a solder connection bonding pad on a surface of a semiconductor structure, the solder connection bonding pad being in electrical contact with a through substrate via (TSV) and including an anchor region adjacent to the TSV that extends into and engages with the semiconductor structure, the anchor region inhibiting the bonding pad from physically separating from the TSV.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
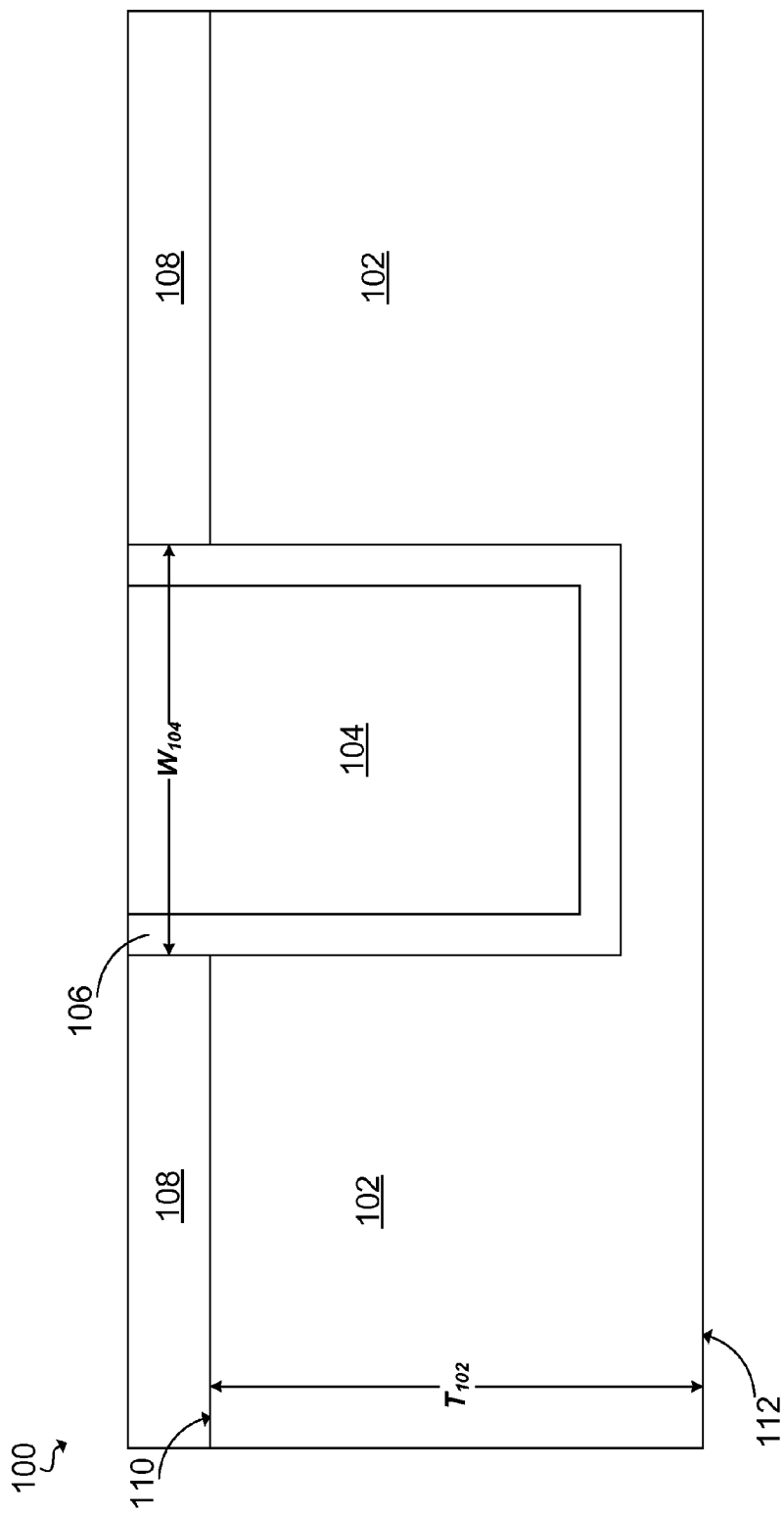
FIG. 1 is a cross section view illustrating forming a TSV in a semiconductor substrate, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

The present invention relates generally to flip chip technology and more particularly, to a method and structure for fabricating a mechanically anchored controlled collapse chip connection (C4) pad on a semiconductor structure. Typically, a C4 pad (hereinafter "bonding pad") may be formed on a back side of a semiconductor wafer after the back side has been thinned to expose TSVs. The bonding pad may formed by depositing a conductive material, typically a metal such as copper, over the exposed bottom surface of the TSV and the back side of the semiconductor wafer.

This technique of forming bonding pads may result in a substantially flat interface between the semiconductor wafer/TSV and the bonding pad. While the flat interface may provide a continuous connection between the TSV and the bonding pad, it may be subject to delamination and separation during fluctuations in temperature of the flip chip (e.g., post chip join cool down). Differences in the coefficients of thermal expansion of the materials that make up the semiconductor wafer, the TSV, and the bonding pad, as well as mechanical stresses resulting from chip stacking, may cause the bonding pad to separate from the semiconductor wafer and the TSV. This separation may cause problems with electrical connections and reliability in the flip chip.

One way to reduce the separation of the bonding pad from the semiconductor wafer and the TSV is to mechanically anchor the bonding pad into the semiconductor wafer. Embodiments by which to anchor the bonding pad to the semiconductor wafer are described below in detail with reference to FIGS. 1-17.

Referring now to FIG. 1, a cross section view of a structure 100 is shown. FIG. 1 illustrates forming a TSV 104 in a semiconductor substrate 102 (hereinafter "substrate) using known techniques. In one embodiment, the substrate 102 may be composed of a bulk semiconductor substrate made from any of several known semiconductor materials such as, for example, Si, strained Si, Ge, SiGe, Si:C, SiGeC, Si alloys, Ge alloys, and compound (e.g. III-V and II-VI) semiconductor materials. Non-limiting examples of compound semiconductor materials include GaAs, InAs, and InP, or any combination thereof. The substrate 102 may be approximately, but is not limited to, several hundred microns thick. For example, the substrate 102 thickness $T_{102}$ may range from approximately 10 μm to approximately 750 μm, although the thickness range may change depending on the applications involved.

Although not depicted in FIG. 1, the substrate 102 may also be composed of a semiconductor on insulator (SOI) substrate. SOI substrates are typically composed of at least an SOI layer overlying a dielectric layer, often referred to as a buried dielectric layer. A base semiconductor layer may be present below the dielectric layer. The SOI layer and the base semiconductor layer may be composed of similar materials as the bulk semiconductor substrate described above. The buried dielectric layer may be formed by implanting a high-energy dopant into a bulk semiconductor substrate, and then annealing the structure to form a buried oxide layer. In another embodiment, the buried dielectric layer may be deposited or grown prior to the formation of the SOI layer. In yet another embodiment, the SOI substrate may be formed using wafer-bonding techniques, where a bonded wafer pair is formed using glue, an adhesive polymer, or direct bonding. The buried dielectric layer may have a thickness ranging from approximately 100 nm to approximately 500 nm thick. The SOI layer may have a thickness similar to the buried dielectric layer and the base semiconductor layer may have a thickness ranging from approximately 10 μm to approximately 750 μm, although the working thickness range may vary depending on the applications.

The TSV 104 may be formed by any known patterning and etching process suitable to form TSVs. In one embodiment, the TSV 104 may be formed by forming a photoresist layer (not shown) over a back end of the line (BEOL) layer 108 on a front side 110 of the substrate 102. The photoresist layer may then be patterned using a photolithography process to expose portions of the BEOL layer 108. The exposed portions of the BEOL layer 108, and portions of the substrate 102 directly below the exposed portions of the BEOL layer 108, may then be etched, preferably using a dry etching process such as reactive ion etching (RIE) to form a TSV trench (not shown).

Next, sidewalls and a bottom of the TSV trench may be coated with an insulating liner 106. The insulating liner 106 may act as a diffusion barrier to prevent conductive material used to form the TSV 104 from migrating into the substrate 102. The insulating liner 106 may be formed by any conventional deposition technique known in the art, such as, for example, atomic layer deposition (ALD), chemical vapor deposition (CVD), physical vapor deposition (PVD), molecular beam deposition (MBD), pulsed laser deposition (PLD), or liquid source misted chemical deposition (LSMCD). In an embodiment, the insulating liner 106 may be composed of silicon oxide, silicon nitride, or another insulator material. The TSV trench may then be filled with a conductive material using any known technique, such as, for example, depositing or electroplating to form the TSV 104. The conductive material may include, but is not limited to, copper (Cu), tungsten (W), alloys thereof, or other metallic materials of sufficiently low resistivity. In an embodiment, a seed layer (not shown) may be deposited on top of the insulating liner 106 to facilitate the electroplating of the conductive material used to form the TSV 104. The seed layer may be composed of one or more layers of a metal nitride, such as, for example titanium nitride (TiN), tantalum nitride (TaN) or other such suitable material. A planarization process, such as chemical mechanical planarization (CMP), may then be performed to remove any excess material from the TSV trench. It should be noted that the TSV 104 may not extend through the entire thickness $T_{102}$ of the substrate 102 to a back side 112 of the substrate 102. In one embodiment, the TSV 104 may extend into an interior region of the substrate 102 at depth that, after backside thinning, may allow for the deposition of a hard mask layer and/or diffusion barrier to be formed on the back side 112 such that a bottom surface of the TSV is flush with a bottom surface of these layers. In one embodiment, the TSV 104 and insulating liner 106 may have a combined width $W_{104}$ ranging from approximately 0.25 µm to approximately 25 µm.

Figure 2:
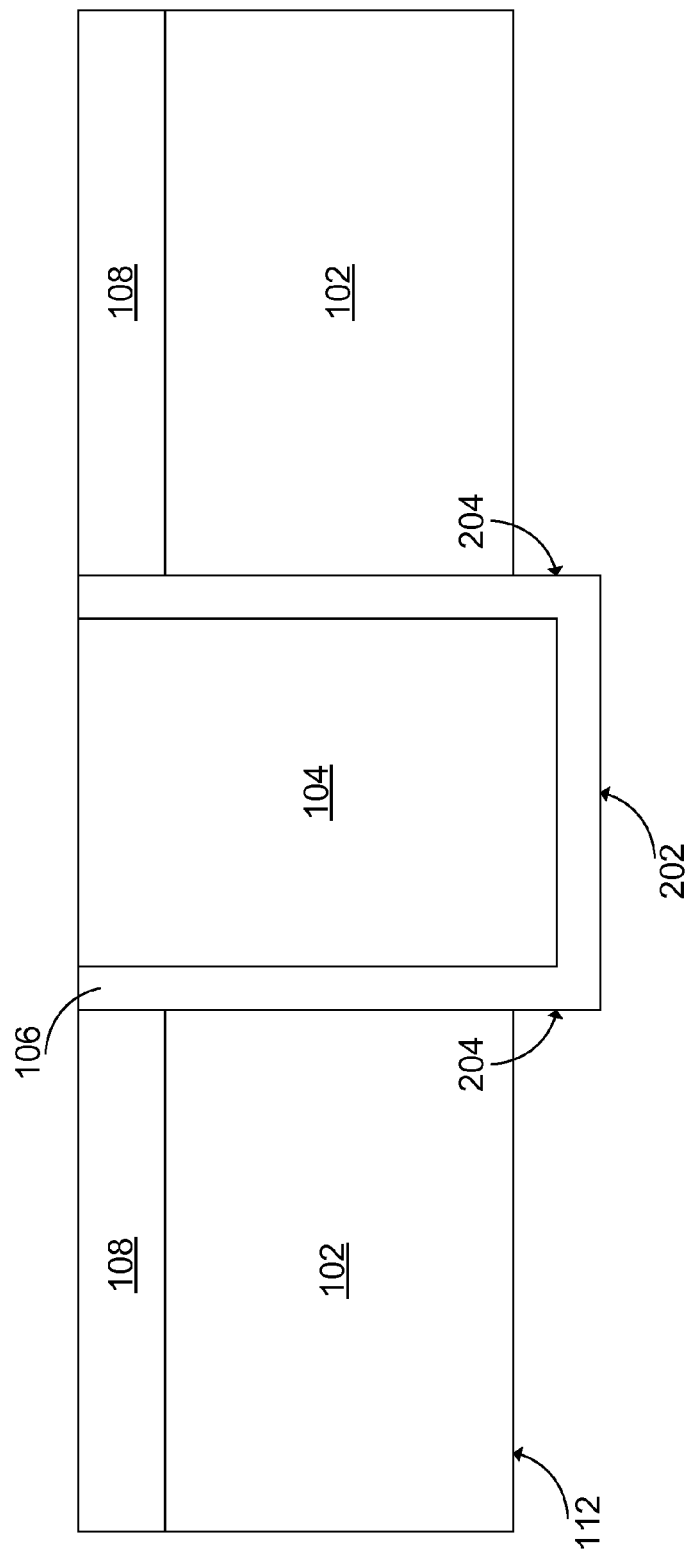
FIG. 2 is a cross section view illustrating thinning a back side of the substrate to expose an insulating liner, according to an embodiment of the present invention.

Referring now to FIG. 2, a cross section view illustrating thinning the back side 112 of the substrate 102 to expose a bottom of the insulating liner 106 is shown. In an embodiment, the back side 112 may be recessed using any known technique, including, for example, hydrofluoric/nitric/acetic (HNA) acid etching, reactive ion etching (RIE), or combinations thereof. In such cases, as illustrated in the figure, the recess technique may remove only portions of the substrate 102 selective to the insulating liner 106, resulting in portions of the insulating liner 106 (e.g., the bottom 202 and portions of the sidewalls 204) remaining above the back side 108. In another embodiment, the back side 112 may be recessed using a combination of substantially a non-selective technique, including, for example, grinding, chemical mechanical planarization (CMP) with the selective techniques described above. The non-selective technique may be used to remove a large portion of the back side 112, but the recession may be finished with the selective techniques.

Figure 3:
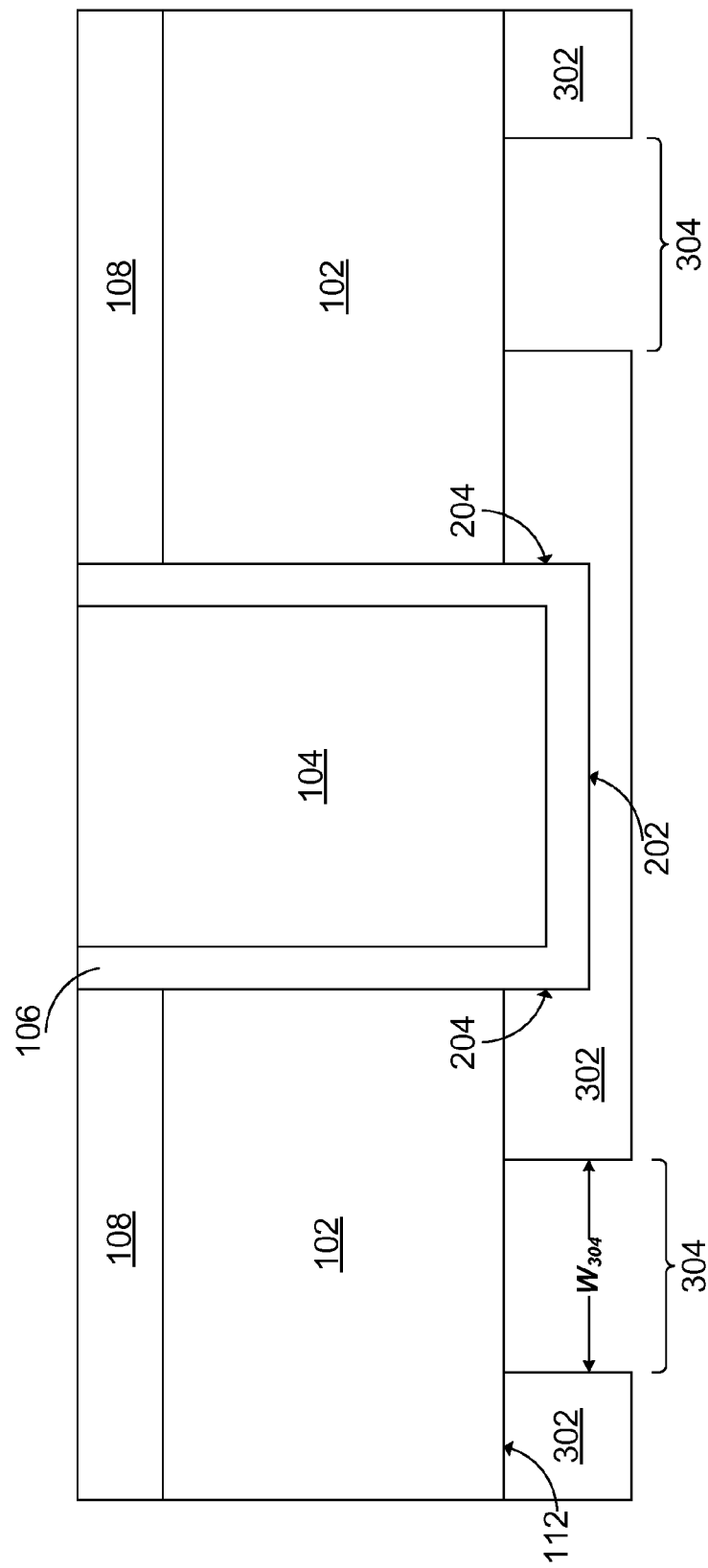
FIG. 3 is a cross section view illustrating forming a patterning layer on the back side and the insulating liner, according to an embodiment of the present invention.

Referring now to FIG. 3, a cross section view illustrating forming a patterning layer 302 on the back side 112 and the insulating liner 106 is shown. The patterning layer 302 may be formed by any conventional deposition technique known in the art, such as, for example, ALD, CVD, PVD, MBD, PLD, or LSMCD. The patterning layer 302 may be composed of any conventional photoresist material, such as for example, a tone photoresist or an organic planarization layer (OPL) with a titanium anti-reflective coating (ARC) layer formed thereon. In an embodiment, the patterning layer 302 may be blanket deposited on the back side 112 and insulating liner 106, and one or more openings 304 (hereinafter "openings") may be formed by conventional lithography techniques. The openings 304 may expose portions of substrate 102 and may have a width $W_{304}$ ranging from approximately 0.5 µm to approximately 7.0 µm.

Figure 4:
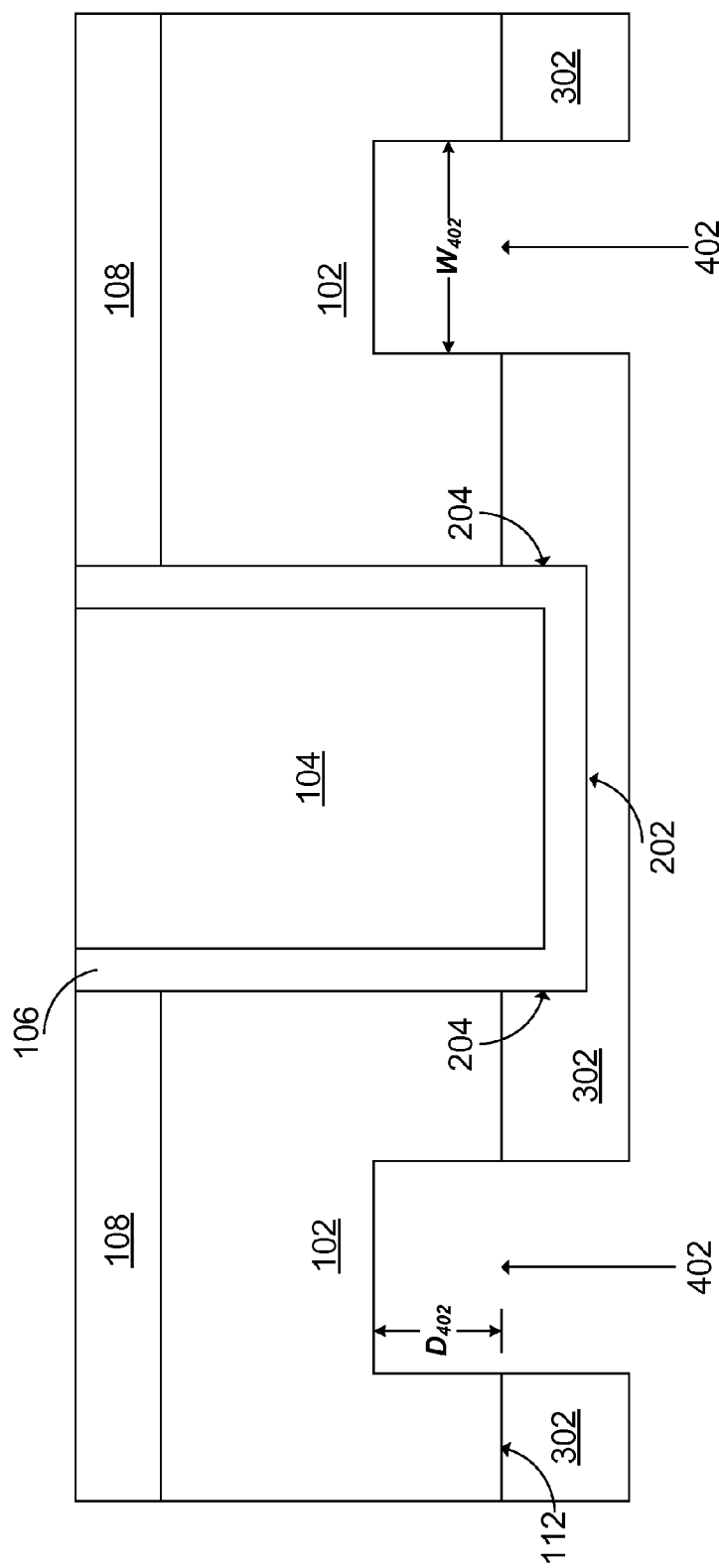
FIG. 4 is a cross section view illustrating forming one or more anchor trenches in the substrate, according to an embodiment of the present invention.

Referring now to FIG. 4, a cross section view illustrating forming one or more anchor trenches 402 (hereinafter "anchor trenches") in the substrate 102 is shown. The anchor trenches 402 may be formed by etching the substrate 102 exposed by the openings 304 (FIG. 3) using conventional anisotropic etching techniques, such as, for example, RIE. The anchor trenches 402 may have a width $W_{402}$ that is substantially similar to the width of the openings 304 (FIG. 3) and a depth $D_{402}$ sufficient to allow a subsequently formed anchor to engage with the substrate 102. In an embodiment, the depth $D_{402}$ of the may range from approximately 0.25 µm to approximately 15 µm. The anchor trenches 402 may have substantially vertical sidewalls.

Figure 5:
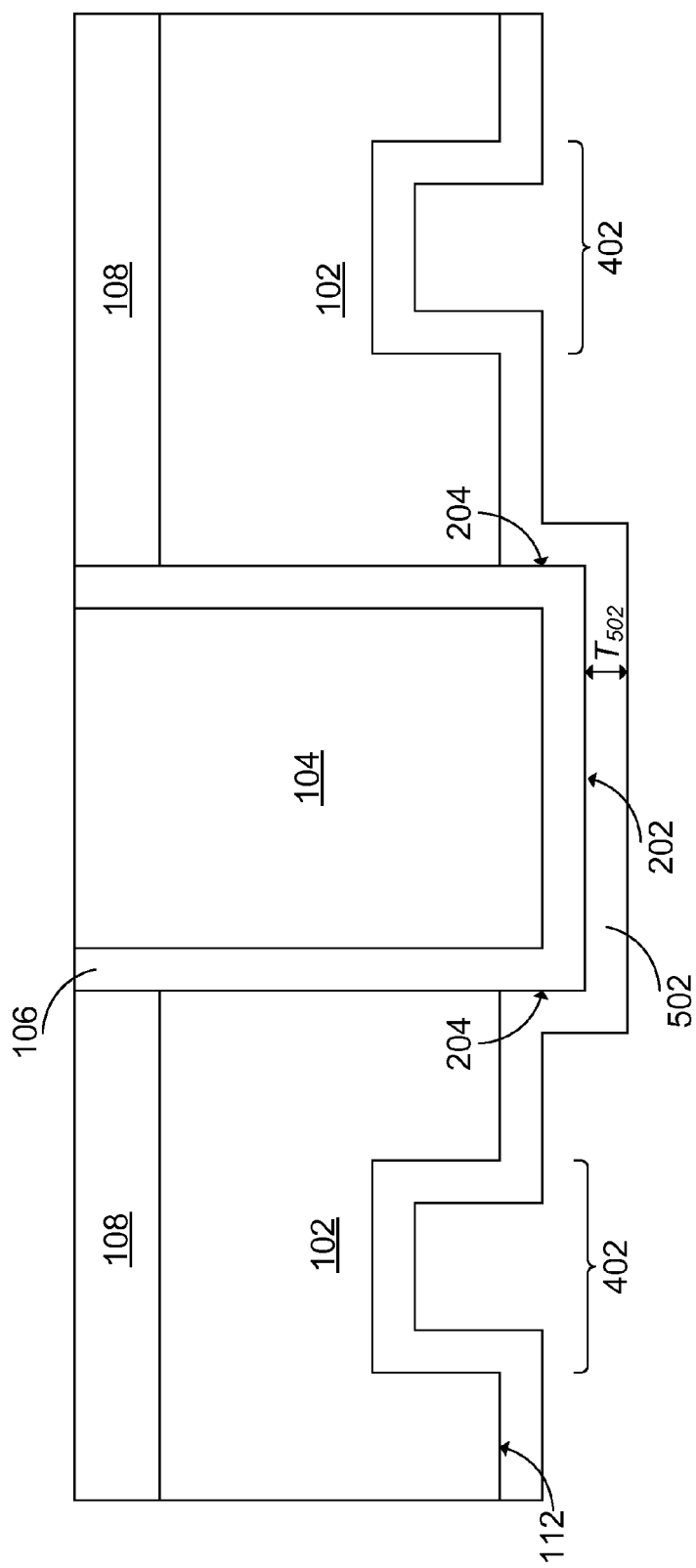
FIG. 5 is a cross section view illustrating removing the patterning layer and forming a diffusion barrier on the back side of the substrate, according to an embodiment of the present invention.

Referring now to FIG. 5, a cross section view illustrating removing the patterning layer 302 (FIG. 4) and forming a diffusion barrier 502 on the back side 112 of the substrate 102 is shown. The patterning layer 302 may be removed by any conventional photoresist stripping technique known in the art. The diffusion barrier 502 may then be deposited on the substrate 102 and the insulating liner 106 by any conventional deposition technique known in the art, such as, for example, ALD, CVD, PVD, MBD, PLD, or LSMCD. In an embodiment, the diffusion barrier 502 may be composed of an oxide, such as $SiO_2$, a nitride, SiN, or a combination thereof. The diffusion barrier 502 may have a thickness $T_{502}$ ranging from approximately 100-500 nm. The diffusion barrier 502 may be conformal so that it is formed within the anchor trenches 402 as well.

Figure 6:
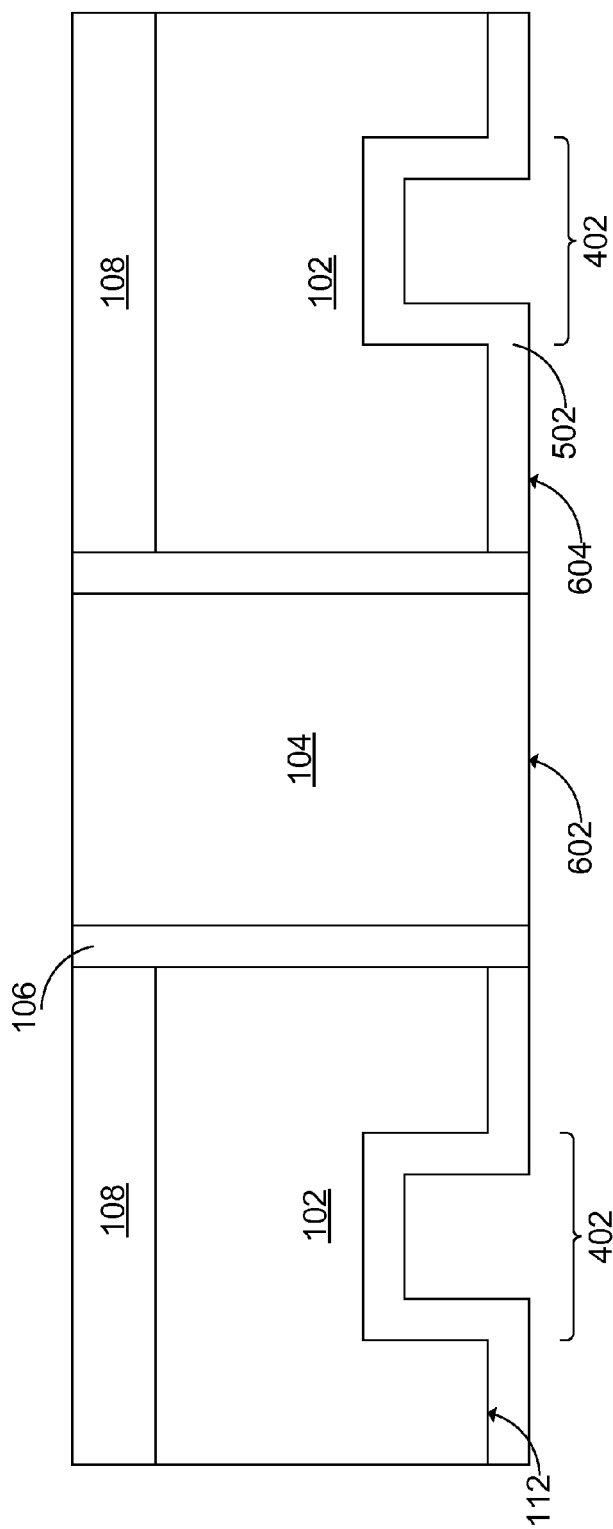
FIG. 6 is a cross section view illustrating removing a portion of the diffusion barrier and portions the insulating liner to expose a bottom TSV surface, according to an embodiment of the present invention.

Referring now to FIG. 6, a cross section view illustrating removing a portion of the diffusion barrier 502 and portions the insulating liner 106 to expose a bottom TSV surface 602 of the TSV 104 is shown. In an embodiment, a conventional non-selective removal technique, such as, CMP may be used to remove a portion of the diffusion barrier 502 and portions of the insulating liner. The portion of the diffusion barrier 502 covering the bottom 202 (FIG. 5) and the portions of the sidewalls 204 (FIG. 5) of the insulating liner 106 may be removed as well as the bottom 202 (FIG. 5) and the portions of the sidewalls 204 (FIG. 5) of the insulating liner 106 themselves so that the bottom TSV surface 602 is substantially flush with a bottom surface 604 of the remaining portions of the diffusion barrier 502.

Figure 7:
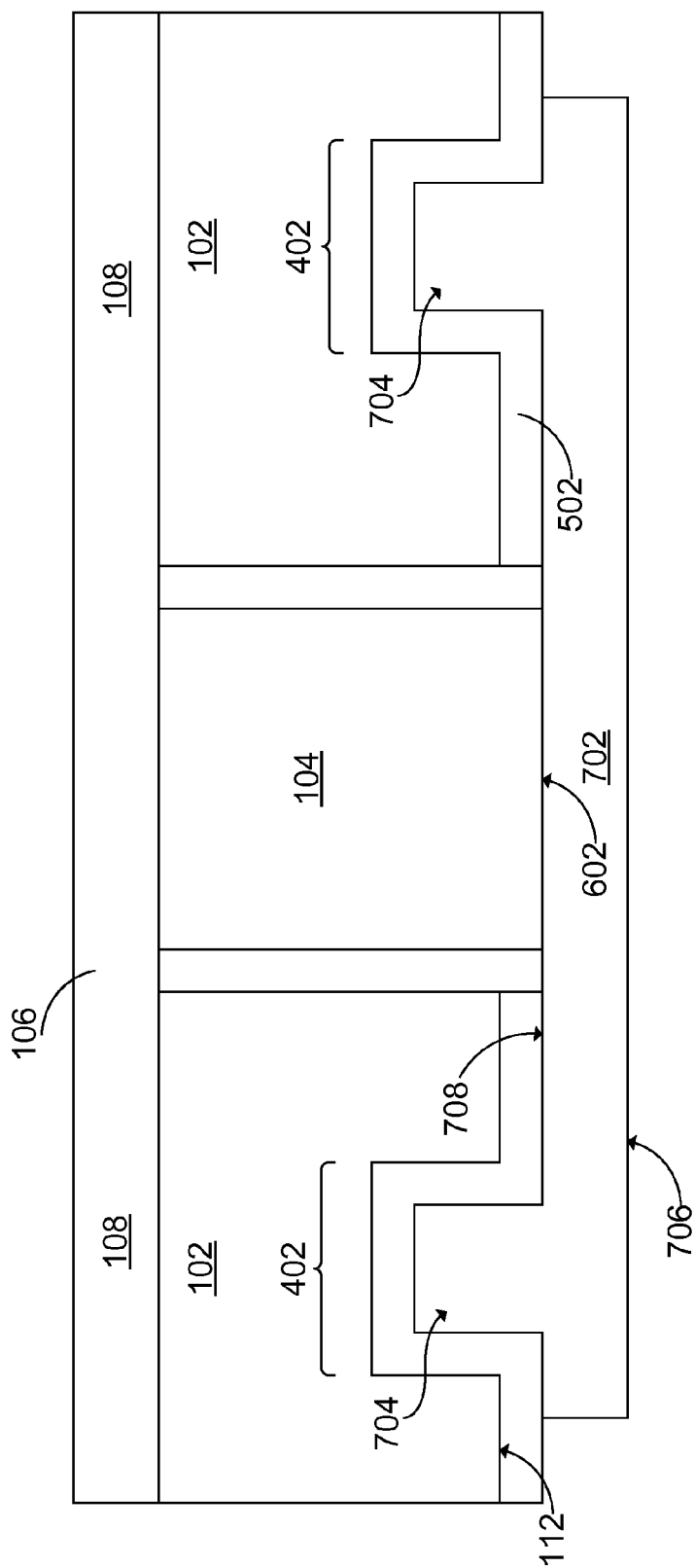
FIG. 7 is a cross section view illustrating forming a bonding pad on the back side of the substrate, according to an embodiment of the present invention.

Referring now to FIG. 7, a cross section view illustrating forming a bonding pad 702 having one or more anchors 704 (hereinafter "anchors") on the bottom TSV surface 602 and the diffusion barrier 502 is shown. In an embodiment, the bonding pad 702 may be formed by any conventional method of forming solder connections known in the art, such as evaporation, plating, stencil printing, paste screening, molten solder injection, and electroplate soldering. The bonding pad 702 may be may be composed of a conductive material such as, but not limited to, Cr, Cu, Al, nickel (Ni), and alloys thereof. The bonding pad 702 may be formed so that the conductive material fills the anchor trenches 402, thereby forming anchors 704 that extend into the substrate 102 and keep the bonding pad 702 in place. In other words, the bonding pad 702 may have a coplanar side 706 opposite the substrate 102 and a non-coplanar side 708 in contact with the substrate 102. The anchors 704 may have substantially vertical sidewalls.

Figure 8:
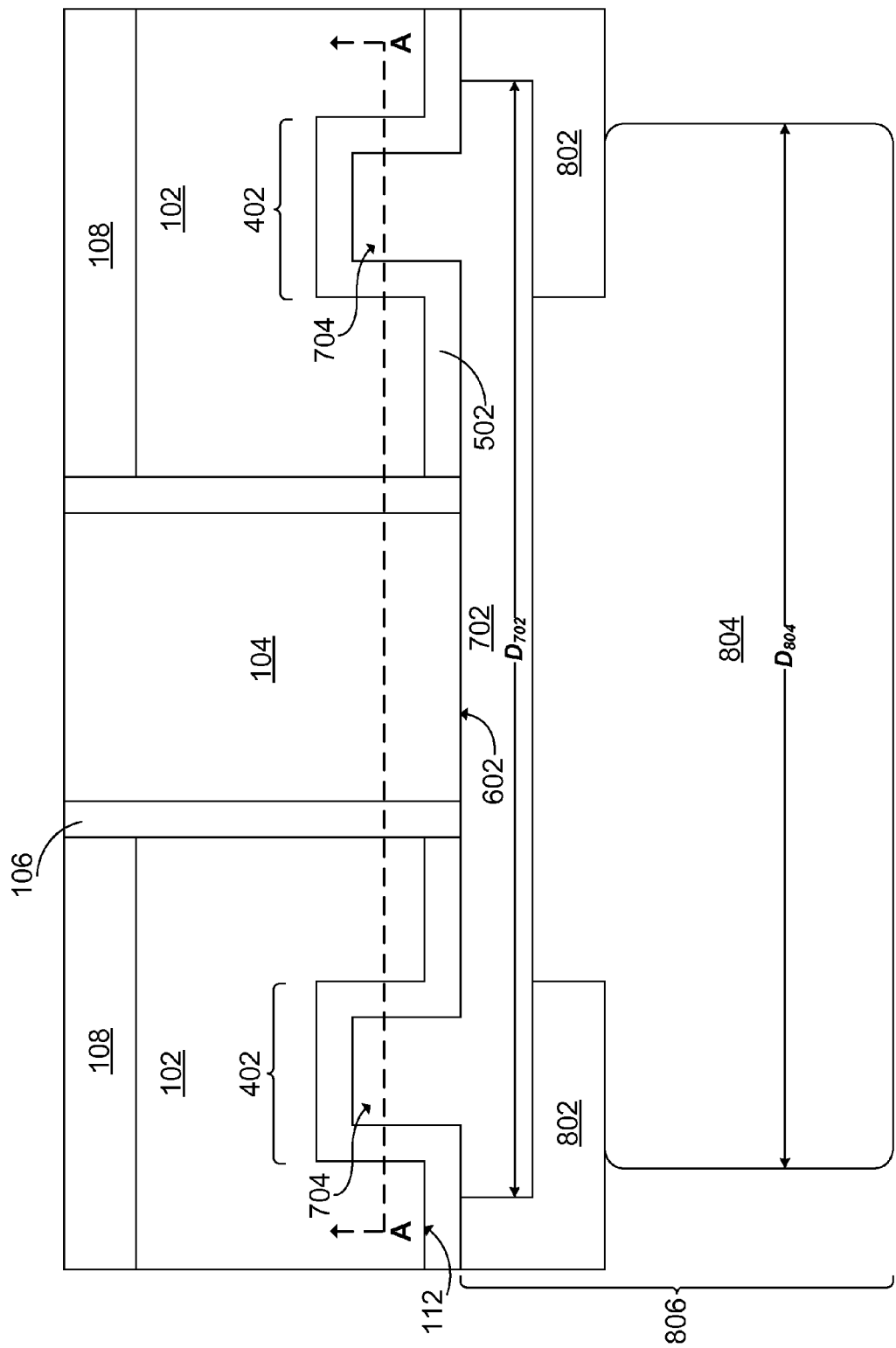
FIG. 8 is a cross section view illustrating forming a solder connection on the bonding pad, according to an embodiment of the present invention.

Referring now to FIG. 8, a cross section view illustrating forming a buffering layer 802 and a solder bump 804 on the bonding pad 702 to form a solder connection 806 is shown. In an embodiment, the buffering layer 802 may be formed on the diffusion barrier 502 adjacent to the bonding pad 702, and on the bonding pad 702 itself. The buffering layer 802 may be composed of an organic material, such as for example a photosensitive polymide (PSPI), polybenzoxazole (PBO), or a combination thereof. The buffering layer 802 may serve to mitigate mechanical stresses caused by any coefficient of thermal expansion (CTE) mismatch between the solder bump 804 and the bonding pad 702 and substrate 102. The buffering layer 802 may be formed by any conventional deposition and masking/etching techniques.

The solder bump 804 may be formed on the bonding pad 702 and on the buffering layer 802. In an embodiment, the solder bump 804 may have a diameter $D_{804}$ that is approximately 85% to approximately 95% of a diameter $D_{702}$ of the bonding pad 702. In another embodiment, the diameter $D_{804}$ of the solder bump 804 may be larger than the diameter $D_{702}$ of the bonding pad 702. In one embodiment, the solder bump 804 may be composed at least one material, such as a lead-free alloy (e.g., gold (Au), a tin/silver/copper (Sn/Ag/Cu) allow, or other lead-free alloys), a lead-containing alloy (e.g., a lead/tin (Pb/Sn) alloy), copper (Cu), aluminum (Al), a conductive polymer, other conductive metals, and combinations thereof. In another embodiment, the solder bump 804 may be composed of multiple layers including, but not limited to, a lower adhesion layer (not shown), a middle reaction barrier layer (not shown), and a wettable upper layer (not shown). The lower adhesion layer may provide adhesion to the bonding pad 702, and may also serve as a diffusion/reaction barrier layer. The lower adhesion layer may be composed of a conductive material, such as, but not limited to chromium (Cr), tantalum (Ta), tungsten (W), titanium (Ti), zirconium (Zr), and alloys and nitrides thereof. The middle reaction barrier layer may be solderable and may be composed of a conductive material such as, but not limited to, Cr, Cu, Al, nickel (Ni), and alloys thereof. The wettable upper layer may allow for easy solder wetability and a fast reaction with solder. The wettable upper layer may be composed of a conductive material such as, but not limited to, Cu. The solder bump 804 may be formed by any conventional method of forming solder bumps known in the art, such as evaporation, plating, stencil printing, paste screening, molten solder injection, and electroplate soldering.

Another embodiment by which to form a bonding pad having anchors is described in detail below by referring to the accompanying drawings FIGS. 9-14. In the present embodiment, a hardmask may be formed on the back side of the wafer after thinning (and before the patterning layer is formed) so that the anchor trenches and anchors may have an undercut profile. It should be noted that the following stages of fabrication of the present embodiment described below may be preceded by the fabrication stages described above with reference to FIGS. 1-2. As such, the following description may continue after the description of FIG. 2.

Figure 9:
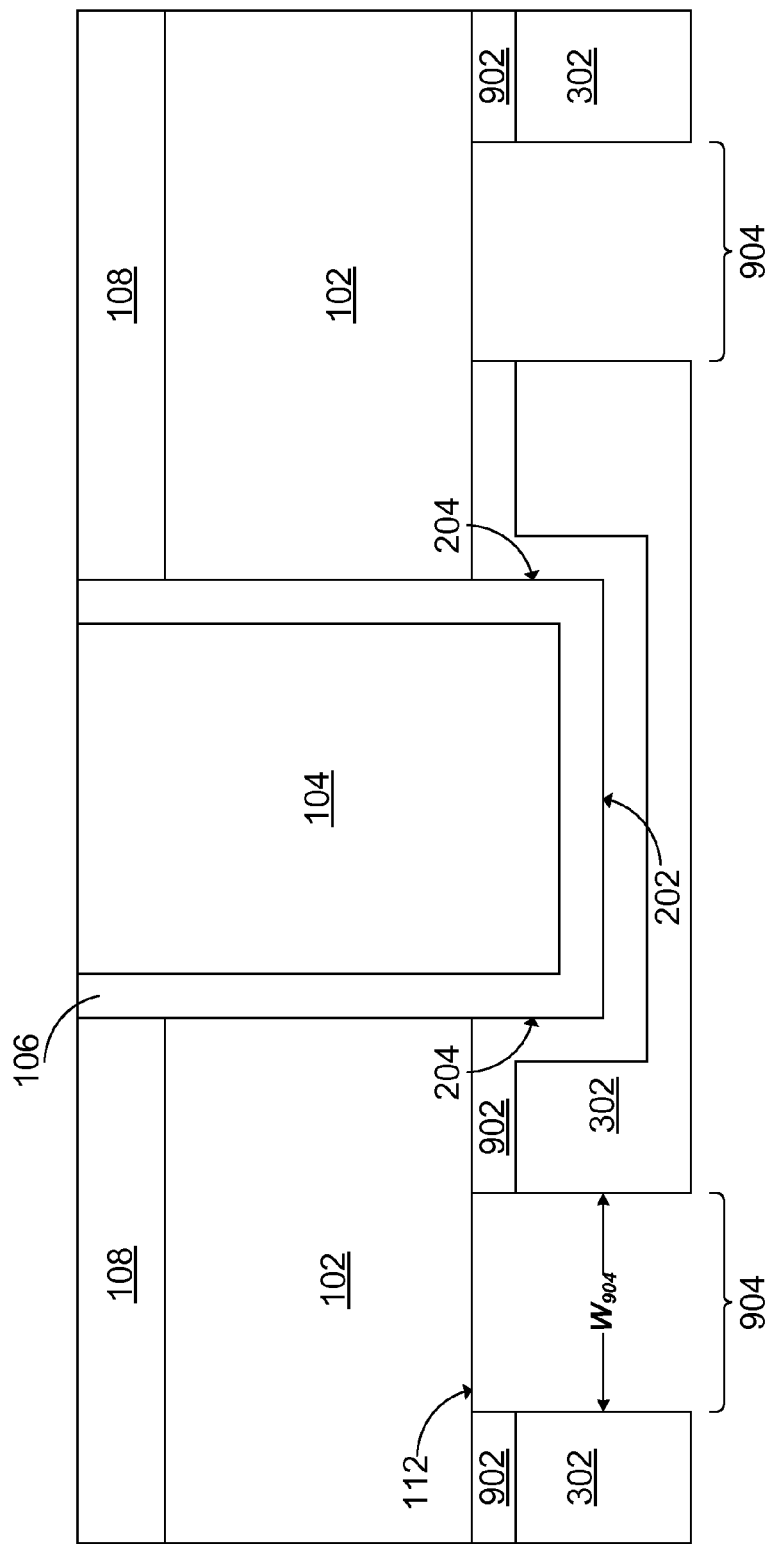
FIG. 9 is a cross section view illustrating forming a hard mask layer on the back side after thinning the substrate but before forming the patterning layer, according to an embodiment of the present invention.

Referring now to FIG. 9, a cross section view illustrating forming a hard mask layer 902 on the back side 112 and the insulating liner 106 after thinning the substrate 102 but before forming the patterning layer 302 is shown. One or more openings 904 (hereinafter "openings") may then be formed in both the hard mask layer 902 and the patterning layer 302. In an embodiment the hard mask layer 902 may be composed of an oxide, such as $SiO_2$, or a nitride, such as SiN, or combinations thereof. The hard mask layer 902 may be formed by any conventional deposition technique known in the art, such as, for example, ALD, CVD, PVD, MBD, PLD, or LSMCD. The hard mask layer may be formed on the back side 112 in order to protect portions of the substrate 102 from a wet etching process used to form undercut anchor trenches as described in detail below with reference to FIG. 10. The patterning layer 302 may then be formed over the hard mask layer 902. The openings 904 may be formed by removing portions of the patterning layer 302 using conventional lithography techniques, such as photolithography, and then etching exposed portions of the hard mask layer 902 selective to the patterning layer 302 and the substrate 102. The openings 904 may expose portions of substrate 102 and may have a width $W_{904}$ ranging from approximately 0.5 to approximately 7.0 μm.

Figure 10:
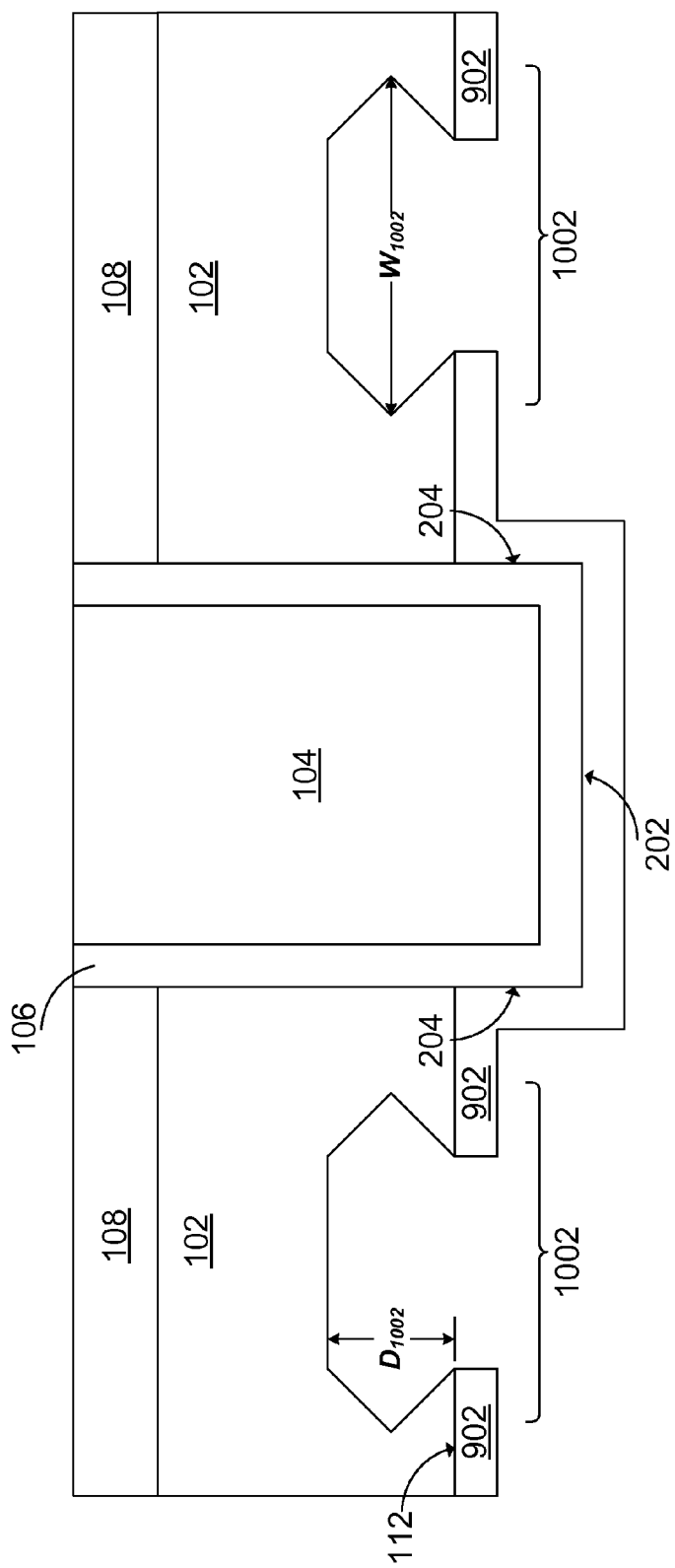
FIG. 10 is a cross section view illustrating removing the patterning layer and then forming one or more undercut anchor trenches in the substrate, according to an embodiment of the present invention.

Referring now to FIG. 10, a cross section view illustrating removing the patterning layer 302 (FIG. 9) and then forming one or more undercut anchor trenches 1002 (hereinafter "undercut anchor trenches") in the substrate 102 is shown. The patterning layer 302 may be removed by any conventional photoresist stripping technique known in the art, leaving behind the hard mask layer 902. The undercut anchor trenches 1002 may then be formed by removing exposed portions of the substrate 102 in the openings 902. In an embodiment, the undercut anchor trenches 1002 may be formed by performing any conventional anisotropic wet etch technique that is selective to the hard mask layer 902, such as, for example, a potassium hydroxide (KOH) wet etch, an ethylene diamine and pyrocatechol (EDP) wet etch, or a tetramethylammonium hydroxide (TMAH) wet etch. In another embodiment, any conventional isotropic wet etch technique that is selective to the hard mask layer 902 may be used to form the undercut anchor trenches 1002. The anisotropic wet etch, or the isotropic wet etch, may give the undercut anchor trenches 1002 an undercut profile that is distinct from the vertical sidewalls of the anchor trenches 402 (FIG. 4) formed by RIE. The undercut anchor trenches may have a width $W_{1002}$ that is larger than the width $W_{904}$ of the openings 904 (FIG. 9) and a height $D_{1002}$ ranging from approximately 0.25 μm to approximately 15 μm.

Figure 11:
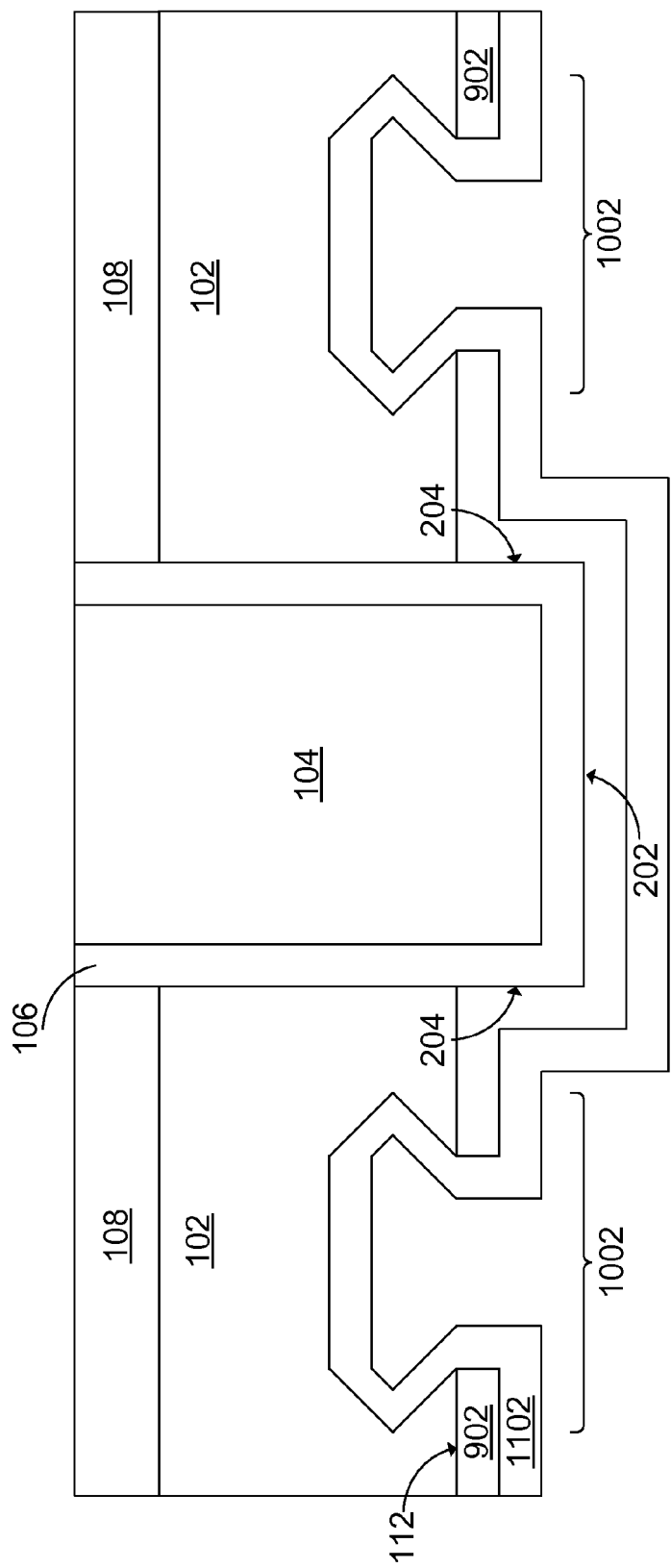
FIG. 11 is a cross section view illustrating forming a diffusion barrier on the hard mask layer and the substrate in the undercut anchor trenches, according to an embodiment of the present invention.

Referring now to FIG. 11, a cross section view illustrating forming a diffusion barrier 1102 on the hard mask layer 902 and the substrate 102 within the undercut anchor trenches 1002 is shown. The diffusion barrier 1102 may be substantially similar to the diffusion barrier 502 (FIG. 5) and formed using substantially similar techniques as those described above with reference to FIG. 5. The diffusion barrier 1102 may be conformal so that is formed on the surfaces of the undercut anchor trenches 1002.

Figure 12:
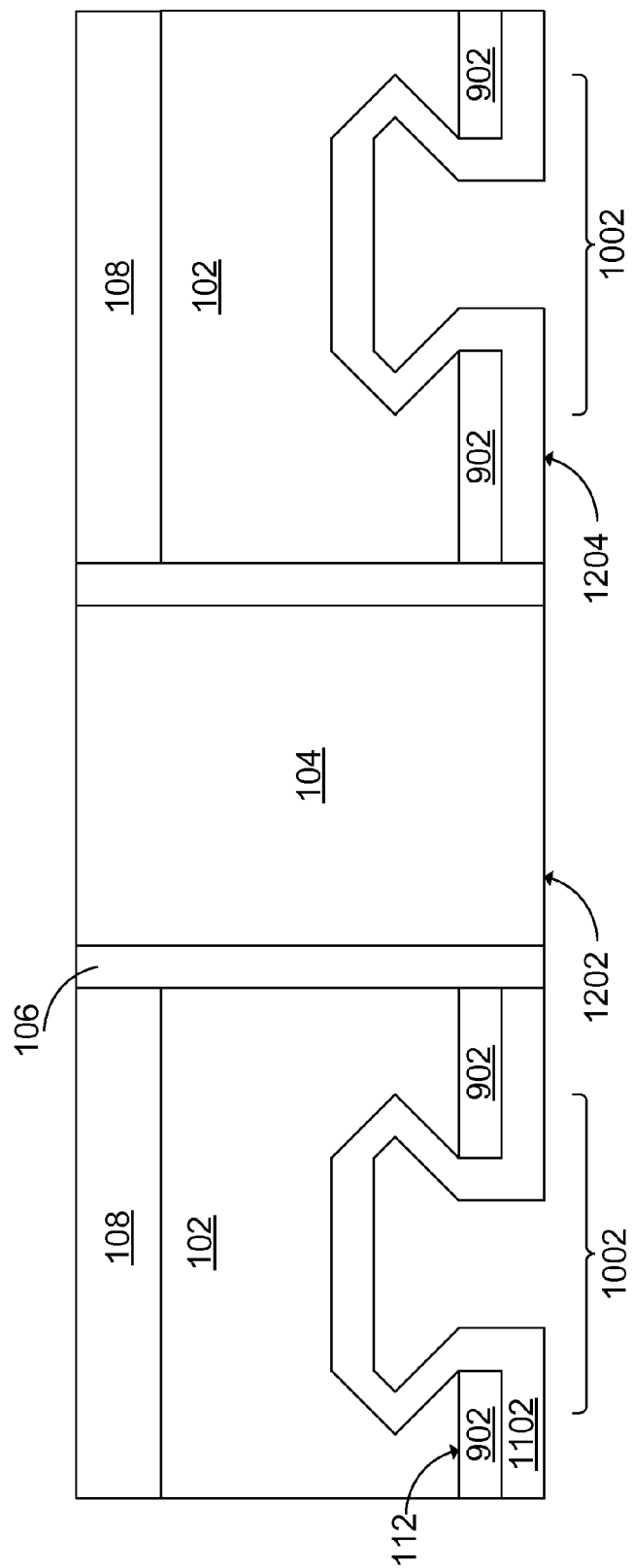
FIG. 12 is a cross section view illustrating removing a portion of the diffusion barrier and portions the hard mask layer and the insulating liner to expose a bottom TSV surface, according to an embodiment of the present invention.

Referring now to FIG. 12, a cross section view illustrating removing a portion of the diffusion barrier 1102 and portions the hard mask layer 902 and the insulating liner 106 to expose a bottom TSV surface 1202 is shown. In an embodiment, a conventional non-selective removal technique, such as, CMP may be used to remove a portion of the diffusion barrier 1102 and portions of the hard mask layer 902 and the insulating liner 106. In addition, a portion of the TSV 104 may be removed such that the bottom TSV surface 1202 is substantially flush with a bottom surface 1204 of the remaining portions of the diffusion barrier 1102.

Figure 13:
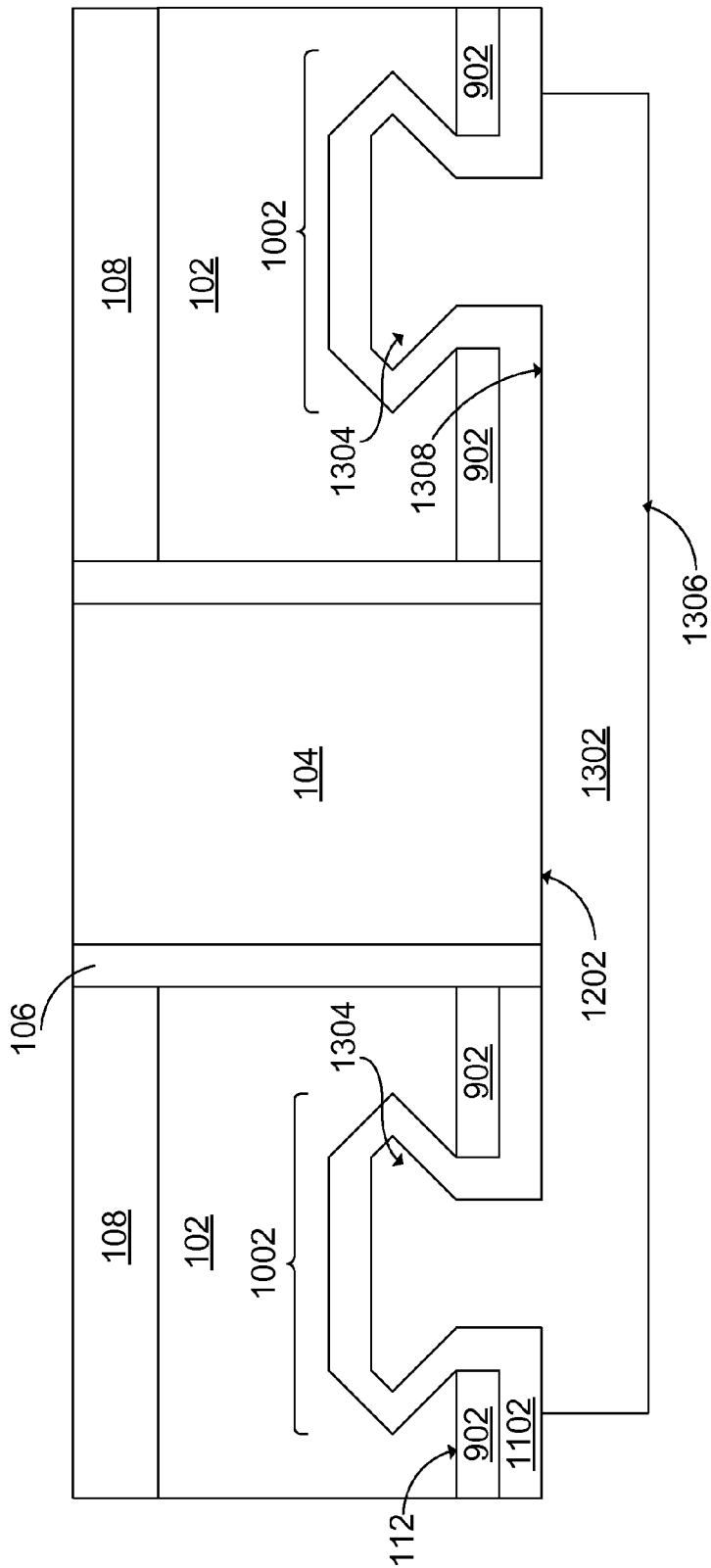
FIG. 13 is a cross section view illustrating forming a bonding pad on the back side of the substrate, according to an embodiment of the present invention.

Referring now to FIG. 13, a cross section view illustrating forming a bonding pad 1302 having one or more undercut anchors 1304 (hereinafter "undercut anchors") on the bottom TSV surface 1202, the diffusion barrier 1102 and the hard mask layer 902 is shown. The bonding pad 1302 may be substantially similar to the bonding pad 702 (FIG. 7) and may be formed using substantially similar techniques as those described about in reference to FIG. 7. The bonding pad 1302 may be formed so that the conductive material fills the undercut anchor trenches 1002, thereby forming undercut anchors 1304 that extend into the substrate 102 and keep the bonding pad 1302 in place. In other words, the bonding pad 1302 may have a coplanar side 1306 opposite the substrate 102 and a non-coplanar side 1308 in contact with the substrate 102. The undercut anchors 1304 may have an undercut profile that is distinct from the vertical sidewalls of the anchors 704 (FIG. 7). This undercut profile may provide an interlocking mechanical connection between the undercut anchors 1304, and the bonding pad 1302, to the substrate 102.

Figure 14:
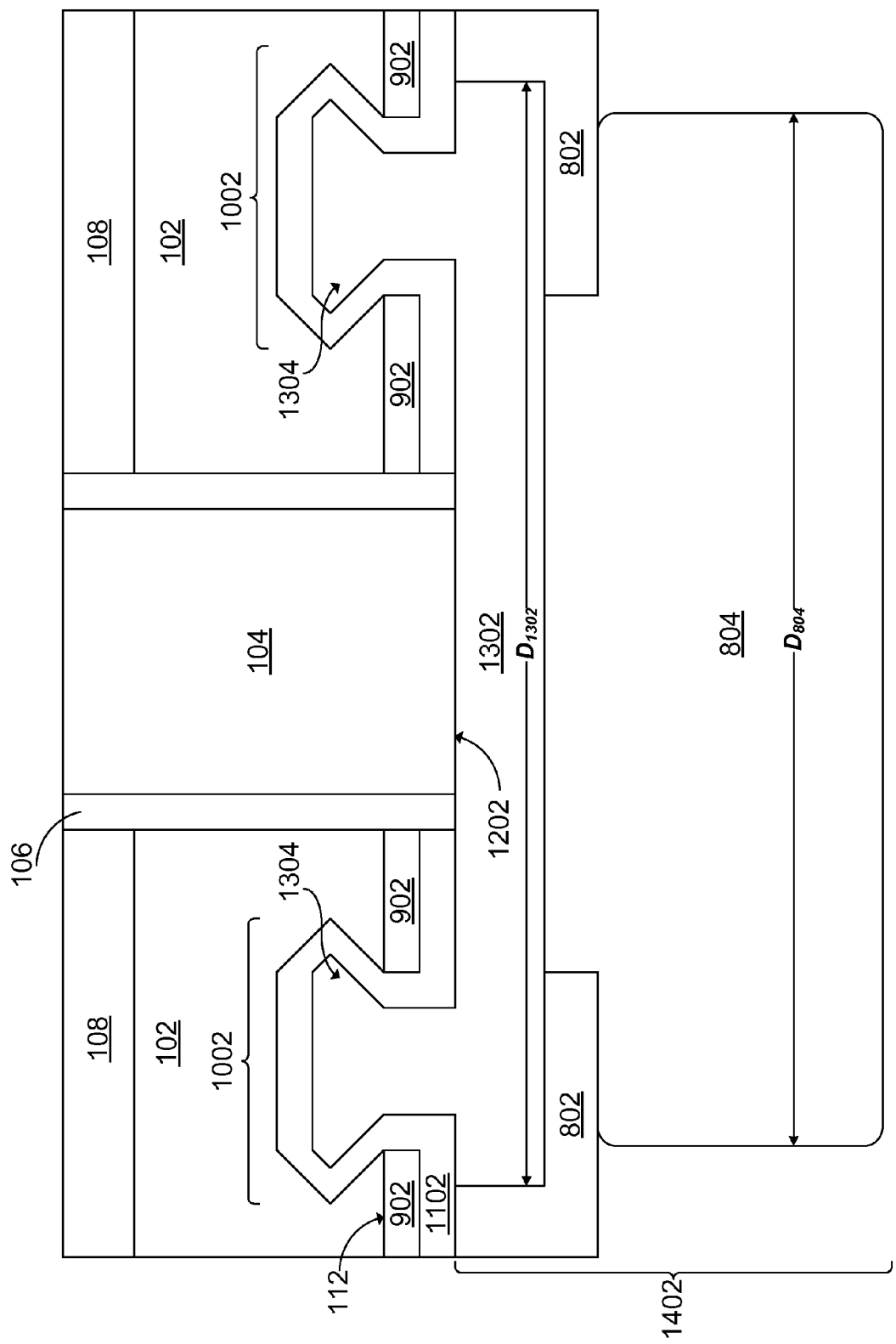
FIG. 14 is a cross section view illustrating forming a solder connection on the bonding pad, according to an embodiment of the present invention.

Referring now to FIG. 14, a cross section view illustrating forming the buffering layer 802 and the solder bump 804 on the bonding pad 1302 to form a solder connection 1402 is shown. The solder connection 1402 may be substantially similar to the solder connection 802 (FIG. 8) and may be formed using substantially similar techniques as those described above with reference to FIG. 8. In an embodiment, the diameter $D_{804}$ of the bonding pad 804 may be approximately 85% to approximately 95% of a diameter $D_{1302}$ of the bonding pad 1302. In another embodiment, the diameter $D_{804}$ of the solder bump may be larger than the diameter $D_{1302}$ of the bonding pad 1302.

Figure 15:
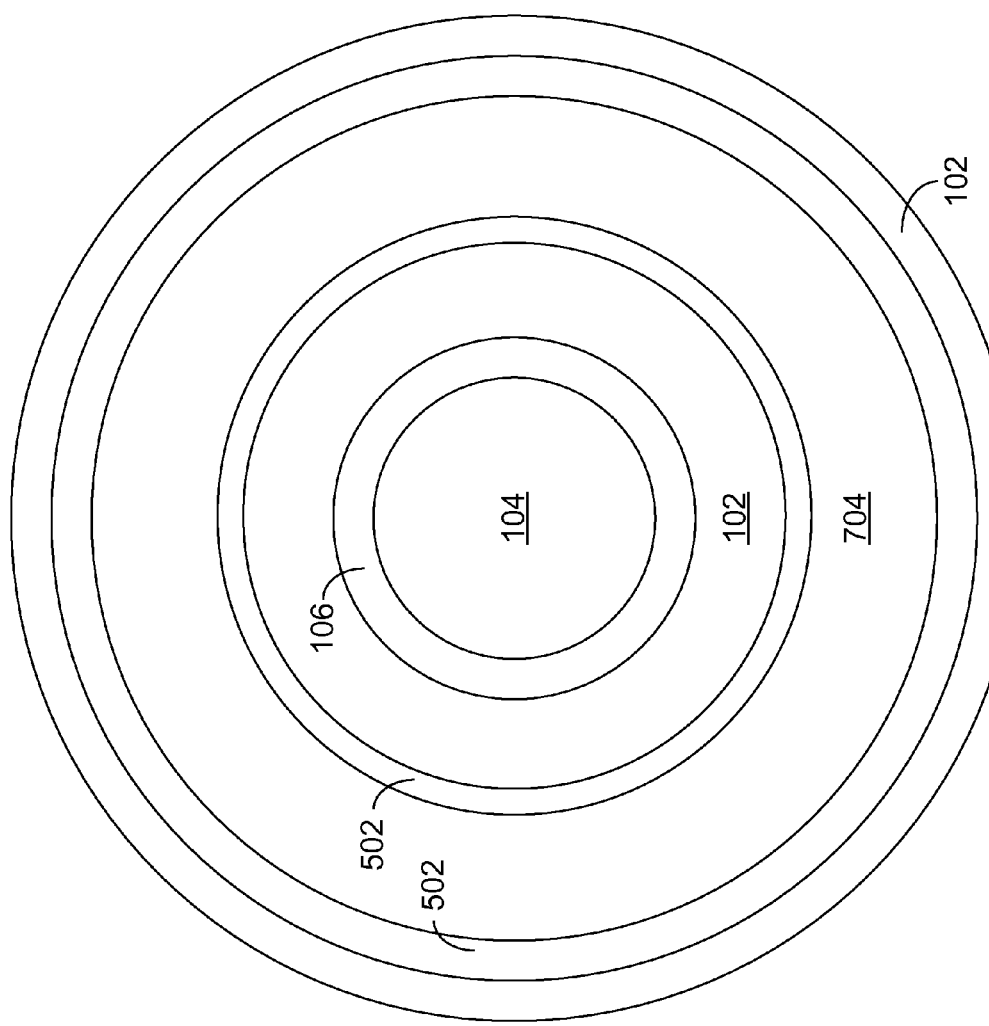
FIGS. 15-17 are cross section views illustrating cross sectional profiles of various embodiments of the anchors.
Figure 16:
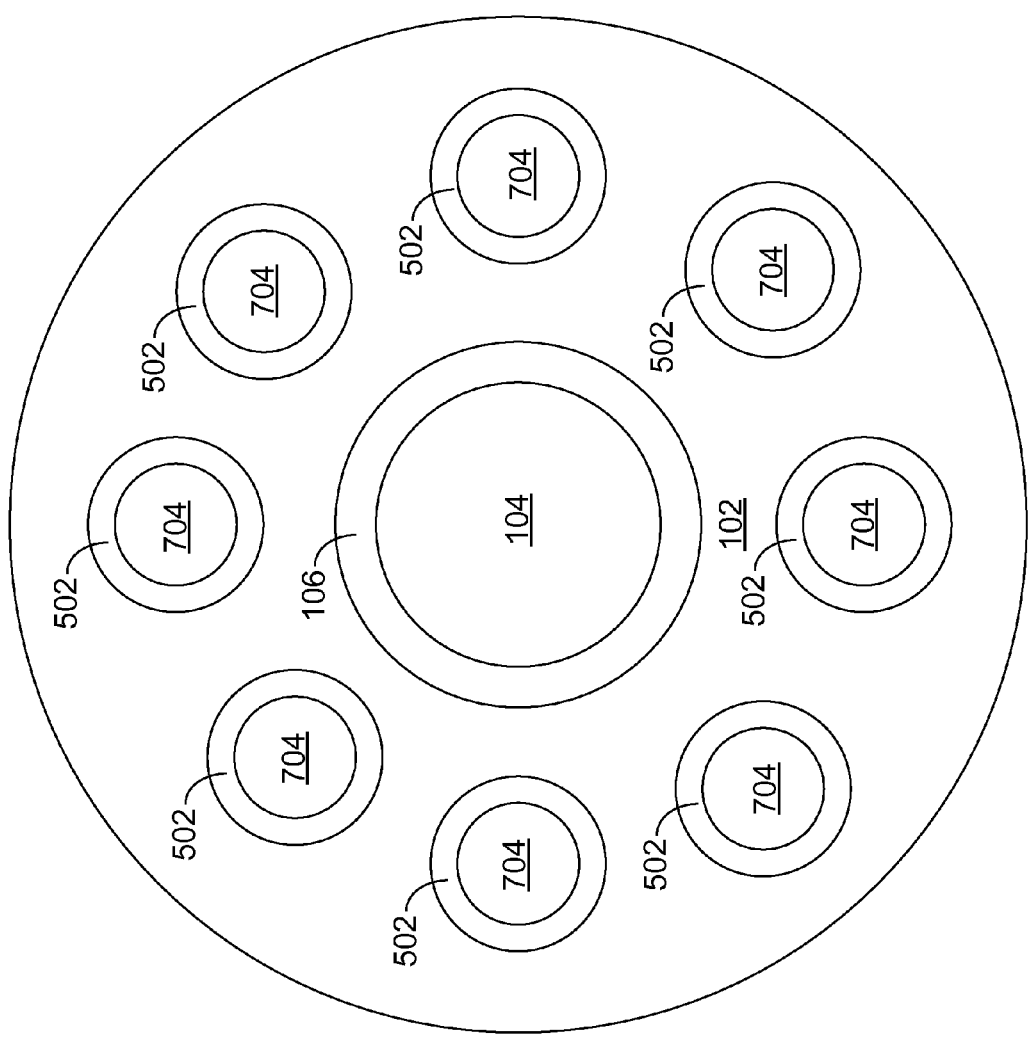
Figure 17:
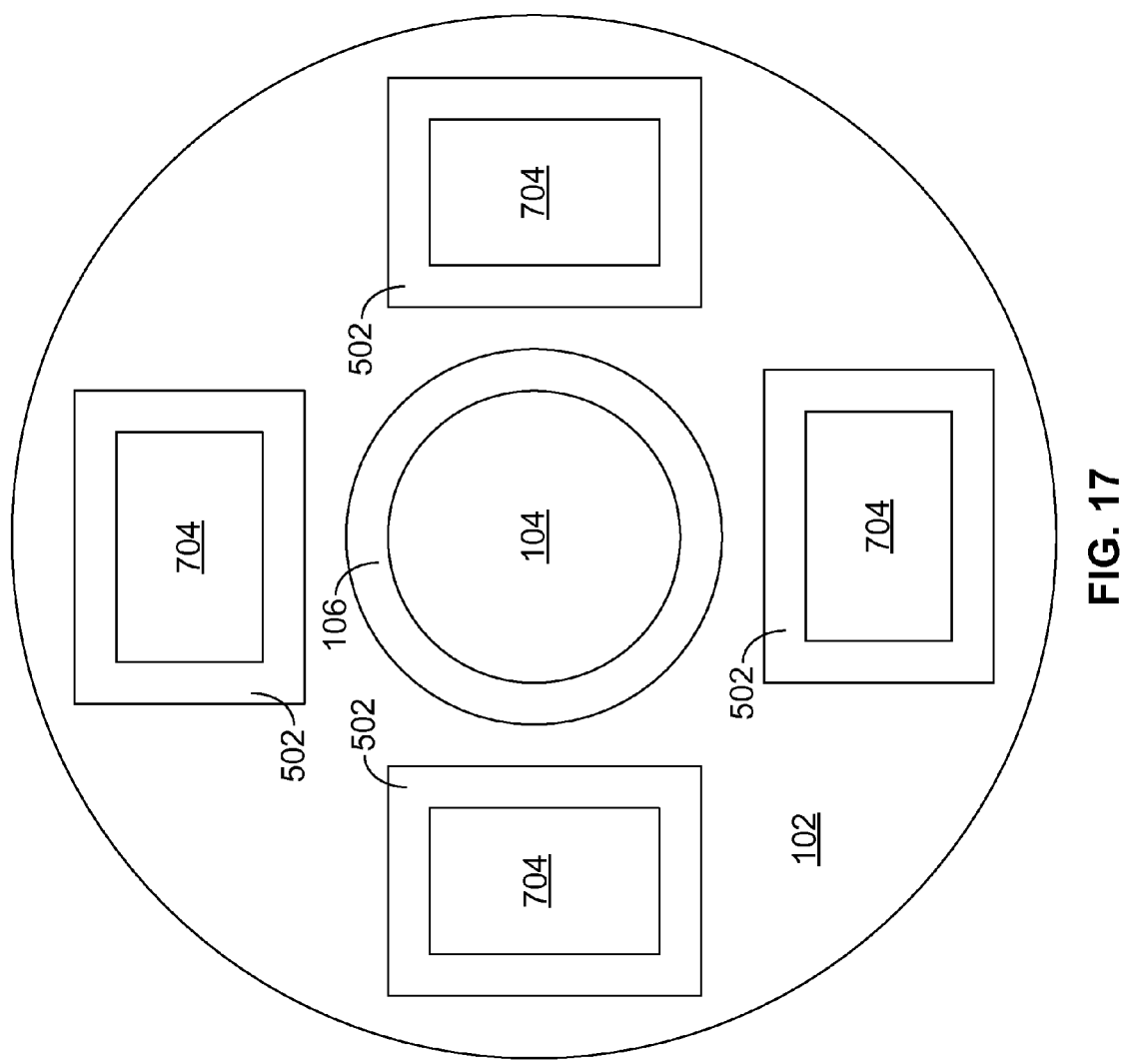

Referring now to FIGS. 15-17 various configurations of the anchors 704 are shown according to alternative embodiments. FIGS. 15-17 illustrate cross sectional profiles of different embodiments of the anchors 704 as shown along section line A-A (FIG. 7). As illustrated in FIG. 15, the anchors 704 may be an annular ring surrounding the TSV 104. As illustrated in FIG. 16, the anchors 704 may be a plurality of anchors arranged around a circumference of the TSV 104. Each individual anchor 704 may have a substantially circular cross section and, together, the anchors 704 may surround the TSV 104. As illustrated in FIG. 17, the anchors 704 may be a plurality of anchors arranged around a circumference of the TSV 104. Each individual anchor 704 may have a substantially rectangular cross section (i.e., a bar via) and, together, the anchors 704 may surround the TSV 104. Although only one bar via per side of the TSV 104 is shown in FIG. 17, embodiments are contemplated in which multiple bar vias may be formed on each side of the TSV 104. It should be noted that the undercut anchors 1304 (FIG. 14) may have substantially similar configurations as the anchors 704 as depicted in FIGS. 15-17.

In embodiments of the present invention, a bonding pad having novel anchors may provide a more durable and robust connection to a TSV during temperature variations than conventional C4 connections. More specifically, the anchors may help reduce the issue of bonding pad delamination (i.e., separation from the substrate and TSV) and/or TSV pistoning (i.e., vertical movement of the TSV) during thermal expansion or contraction due to the materials used having different CTEs. It should be noted that although the anchors 704 (FIG. 8) and the undercut anchors 1304 (FIG. 14) are depicted as being formed on the back side 112 of the substrate 102, embodiments are contemplated in which the anchors 704 (FIG. 8) and the undercut anchors 1304 (FIG. 14) are formed in the BEOL layer 108 to secure front side C4 connections as well.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A method comprising:
forming a via structure that extends from a front side of a semiconductor substrate to an interior region of the semiconductor substrate;
recessing a back side of the substrate to expose a bottom surface of the, thereby yielding a through substrate via (TSV) from the via structure, wherein the recessing further includes: thinning the semiconductor substrate, and forming a hard mask layer on the back side of the semiconductor substrate;
forming an anchor trench in the back side of the semiconductor substrate adjacent to the TSV, wherein the forming of the anchor trench includes forming an opening in the hard mask layer;
removing a portion of the hard mask layer to expose the TSV at the back side of the semiconductor structure;
forming a diffusion barrier on the back side of the semiconductor substrate and within the anchor trench, such that the bottom surface of the TSV is substantially coplanar with a portion of the diffusion barrier, and such that a remainder of the hard mask layer is positioned outside a portion of the diffusion barrier surrounding the anchor trench; and
depositing a conductive material on the diffusion barrier and within the anchor trench to form a bonding pad comprising an anchor region, such that the conductive material is in direct electrical contact with the bottom surface of the TSV.

2. The method of claim 1, wherein the anchor region inhibits the bonding pad from separating from the semiconductor substrate during thermal expansion or contraction, thereby keeping the electrical connection between the bonding pad and the TSV intact.

3. The method of claim 1, wherein the forming the anchor trench in the back side of the semiconductor substrate adjacent to the TSV comprises:
forming a trench having substantially vertical sidewalls.

4. The method of claim 1, wherein the forming the anchor trench in the back side of the semiconductor substrate adjacent to the TSV comprises:
forming a trench having an undercut profile.

5. The method of claim 1, wherein the forming the anchor trench in the back side of the semiconductor substrate adjacent to the TSV comprises:
forming an annular anchor trench surrounding the TSV.

6. The method of claim 1, wherein the forming the anchor trench in the back side of the semiconductor substrate adjacent to the TSV comprises:
forming a plurality of anchor trenches, each having a substantially circular cross section, arranged in a circular configuration around at least a portion of a circumference of the TSV.

7. The method of claim 1, wherein the forming the anchor trench in the back side of the semiconductor substrate adjacent to the TSV comprises:
forming a plurality of anchor trenches, each having a substantially rectangular cross section, arranged in a circular configuration around at least a portion of a circumference of the TSV.

8. A structure comprising:
a through substrate via (TSV) extending from a front side of a semiconductor substrate to a back side of the semiconductor substrate, the TSV comprises a first conductive material;
a bonding pad on the back side of the semiconductor substrate in direct contact with a bottom surface of the TSV, wherein the bonding pad comprises a second conductive material and an anchor region extending into and engaging the semiconductor substrate adjacent to the TSV;
a diffusion barrier between the bonding pad and the semiconductor substrate to prevent the second conductive material of the bonding pad from diffusing into the semiconductor substrate; and a hard mask layer located between the back side of the semiconductor substrate and the diffusion barrier, but not between a portion of the diffusion barrier surrounding the anchor and the semiconductor substrate.

9. The structure of claim 8, further comprising:
a solder connection on the bonding pad.

10. The structure of claim 8, further comprising:
an insulating liner on a sidewall of the TSV to prevent the first conductive material from diffusing into the semiconductor substrate.

11. The structure of claim 8, wherein the anchor region comprises substantially vertical sidewalls.

12. The structure of claim 8, wherein the anchor region comprises an undercut profile enabling the bonding pad to interlock with the semiconductor substrate.

13. The structure of claim 8, wherein the anchor region comprises:
an annular anchor surrounding the TSV.

14. The structure of claim 8, wherein the anchor region comprises:
a plurality of anchors, each having a substantially circular cross section, arranged in a circular configuration around at least a portion of a circumference of the TSV.

15. The structure of claim 8, wherein the anchor region comprises:
a plurality of anchors, each having a substantially rectangular cross section, arranged in a circular configuration around at least a portion of a circumference of the TSV.

16. A method comprising:
providing a semiconductor structure including:
a substrate,
a through-substrate via (TSV) extending from a front surface of the substrate to a back surface of the substrate,
a hard mask positioned directly laterally adjacent to the TSV on the back surface of the substrate,
an anchor trench positioned directly laterally adjacent to the hard mask on the back surface of the substrate, such that the hard mask separates the anchor trench from the TSV, and
a diffusion barrier lining the anchor trench and the hard mask, wherein the diffusion barrier on the hard mask is substantially coplanar with the TSV; and
forming a solder connection bonding pad on the diffusion barrier positioned on the back surface of the semiconductor structure, the solder connection bonding pad being in electrical contact with the TSV;
wherein the solder connection includes an anchor region adjacent to the TSV and extending into and engaging with the diffusion barrier within the anchor trench of the semiconductor structure, the anchor region inhibiting the bonding pad from physically separating from the TSV.

17. The method of claim 16, wherein the anchor region has substantially vertical sidewalls.

18. The method of claim 16, wherein the anchor region has an undercut profile enabling the bonding pad to interlock with the semiconductor substrate.

* * * * *